United States Patent
Bergstedt et al.

(10) Patent No.: US 6,370,030 B1
(45) Date of Patent: *Apr. 9, 2002

(54) DEVICE AND METHOD IN ELECTRONICS SYSTEMS

(75) Inventors: Leif Roland Bergstedt, Sjömarken; Bo Roland Carlberg, Lerum, both of (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,314

(22) Filed: Jul. 10, 1998

(30) Foreign Application Priority Data

Jul. 11, 1997 (SE) ................................. 9702687

(51) Int. Cl.$^7$ ............................. H05K 1/00; H05K 1/18; H05K 7/02; H05K 7/06; H05K 7/08
(52) U.S. Cl. ..................... 361/748; 361/760; 361/761; 361/762; 361/679; 361/770; 361/779; 29/840; 29/830; 29/831; 29/854; 174/259; 174/260
(58) Field of Search ................... 174/260, 259; 361/760, 761, 768, 762, 770, 771, 779, 679, 748; 29/840, 830, 831, 832, 854

(56) References Cited

U.S. PATENT DOCUMENTS

| | | | |
|---|---|---|---|
| 2,800,634 A | | 7/1957 | Crieg et al. |
| 3,904,997 A | | 9/1975 | Stinehelfer, Sr. |
| 4,211,986 A | | 7/1980 | Tajima |
| 4,254,383 A | | 3/1981 | Wolfe |
| 4,647,880 A | | 3/1987 | Argaman |
| 4,811,170 A | * | 3/1989 | Pammer .................. 361/400 X |
| 4,843,695 A | * | 7/1989 | Doe et al. ................. 29/827 X |
| 5,071,787 A | * | 12/1991 | Mori et al. .............. 437/183 X |
| 5,280,139 A | * | 1/1994 | Suppelsa et al. ........ 174/260 X |
| 5,384,688 A | * | 1/1995 | Rockwell ................. 361/736 X |
| 5,386,343 A | * | 1/1995 | Pao ......................... 361/761 X |
| 5,412,538 A | * | 5/1995 | Kikinis et al. ........... 361/792 X |
| 5,428,505 A | * | 6/1995 | Sakemi et al. .......... 361/777 X |
| 5,430,614 A | * | 7/1995 | Difrancesco ............ 361/785 X |
| 5,488,540 A | * | 1/1996 | Hatta ....................... 361/794 X |
| 5,525,763 A | * | 6/1996 | Van Liere ................ 174/263 X |
| 5,534,467 A | * | 7/1996 | Rostoker ................. 437/209 X |
| 5,566,441 A | * | 10/1996 | Marsh et al. ............. 29/600 X |
| 5,570,274 A | * | 10/1996 | Saito et al. .............. 361/784 X |
| 5,574,629 A | * | 11/1996 | Sullivan .................. 361/767 X |
| 5,576,934 A | * | 11/1996 | Roethlingshoefer et al. ..... 361/761 X |
| 5,604,977 A | * | 2/1997 | Robinson et al. ......... 29/825 X |

* cited by examiner

*Primary Examiner*—Joe H. Cheng
*Assistant Examiner*—Binh-An D. Nguyen
(74) *Attorney, Agent, or Firm*—Burns, Doane, Swecker & Mathis, L.L.P.

(57) ABSTRACT

The present invention relates to a device and a method at a printed board for obtaining good transmission qualities in transmission conductors on a predetermined area (10) of the printed board (11). A separate component (1) for signal transmission comprises a conductor (5). The component (1) is mounted, with the conductor facing the printed board (11), over the area (10) of the printd board, which requires good transmissions qualities, whereby an air gap (L) is obtained between the conductor (5) and the printed board (11). Soldering joints (21) connect each one of the outer parts (7a, 7b) of the conductor (5) of the component (1) to corresponding pattern conductors (17a, 17b) on the printed board (11). The thickness of the soldering connections and the thickness of the pattern conductors form the air gap (L) be the conductor (5) and the printed board (11). In an alternative embodiment according to the invention, a groove (23) is milled out of the printed board (11) under the conductor (5), obtaining an enlarged air gap between the conductor (5) and the printed board (1).

8 Claims, 3 Drawing Sheets

DEVICE AND METHOD IN ELECTRONICS SYSTEMS

This application claims priority under 35 U.S.C. §§119 and/or 365 to 9702687-6 filed in Sweden on Jul. 11, 1997; the entire content of which is hereby incorporated by reference.

TECHNICAL FIELD

The present invention relates to a device and a method at printed boards for use in electronics systems.

BACKGROUND OF THE INVENTION

A simple printed board according to prior art consists of a number of layers, wherein the lowest layer is termed support in the text below. The support is made of a suitable electrically conductive material, for instance brass, copper or aluminium. Transmission conductors, also termed conductors below, are etched out of an electrically conductive conductive pattern layer of the printed board, wherein a layer of dielectric material separates the conductive pattern layer frown the support. The conductors connect components on the printed board electrically to each other as desired.

An electromagnetic field occurs in a known manner between the conductors and the support of the printed board, wherein part the electromagnetic field is lost in the dielectric. This is specifically related to printed board assemblys used at high frequencies above 1 GHz, as energy losses can be significant and large amounts of heat is liberated in the conductors.

Examples of said problems with losses in the dielectric are at long transports of high frequency signals in the conductors, and communication between modules, so-called MCM (Multi Chip Modules). The modules, working independently at high frequencies, are mounted on a common so-called mother board. This board is made of a cheaper material, because the electronics on the mother board operates at low frequencies.

One known method for minimizing said losses occurring in the printed board assembly is to use a dielectric with good high frequency qualities.

A disadvantage with this method is that these dielectrics are expensive to use in the printed board assembly.

Another method according to prior art is to mill out a groove with air of the dielectric between the conductor and the support. The dielectric field from the conductor then passes through the air groove, implying remarkably decreased losses of the conductor compared to a solid dielectric.

A disadvantage with the method above is that it is complicated and requires long time to perform.

U.S. Pat. No. 3,904,997 discloses a conductor attached to a dielectric material. An electrically conductive ground plane, comprising a channel, has contact with the dielectric, so the conductor is enclosed in the channel with an air gap to the ground plane.

In U.S. Pat. No. 2,800,634 a method for the losses of a wave guide for instance on a printed board assembly operating at high frequencies is disclosed. Thereby, an air gap is employed between a ground plane and the wave guide, wherein a layer of dielectric material of the printed board is arranged to the ground plane and builds up the air gap between the ground plane and the conductor.

SUMMARY OF THE INVENTION

One problem that is solved by the invention is to obtain good transmission qualities in a non-expensive manner of conductors in a predetermined area of a printed board, in particular employed at high frequencies.

Thus, the object of the present invention is to obtain good transmission qualities in a non-expensive manner for transmission conductors at a predetermined area of printed boards.

To solve this problem, the present invention employs mounting of a separate component for signal transmission on a predetermined area where good transmission qualities on the printed board is required. An area of the component, facing the printed board, comprises a conductor, wherein air gap is obtained between the conductor and the printed board. The produced printed board with its component has an air gap which is well adapted to the conductor.

In more detail, the problem is solved as follows. The component comprises a layer of dielectric material, plated with an electrically conductive layer, and the conductor is etched out of this electrically conductive layer.

The printed board comprises a support of an electrically conductive material, wherein one layer of dielectric is attached to the support. Conductor patterns are etched out of an electrically conductive pattern layer on the dielectric layer. The printed board is on a predetermined area, requiring good transmission qualities, provided with a mounting surface for the component.

Subsequently, the component is mounts with the conductor facing the printed board, to the mounting surface of the printed board. Electrically conductive attachment joints, also termed attachment joints below, for instance soldering joints or joints of electrically conductive glue, connects each one of the outer parts of the conductor with corresponding pattern conductor on the printed board. The thickness of the attachment joints achieve herein an air gap between the conductor and the printed board.

According to another alternative embodiment of the invention, a groove is milled out of the dielectric layer of the printed board above, wherein the groove is arranged under the conductor, obtaining an enlarged air between the conductor and the printed board.

If yet better transmission qualities a required of an area of the printed board, the dielectric layer of the component can consist of a dielectric with good high frequency qualities.

An advantage of the present invention is that it is simple and non-expensive to use, since well-known standard materials can be employed. Only the component must if required be made of a more expensive material with good high frequency qualities.

An other advantage of the present invention is that good transmission qualities easily can be obtained at predetermined local places or areas of the printed board.

The invention will now be described in more detail illustrated by preferred embodiments of the invention and with reference to accompanying drawings.

DETAILED DESCRIPTION OF PREFERRED EMBODIMENTS

In the following examples, the invention will be further described with reference to FIGS. 1–4.

Figure 1:
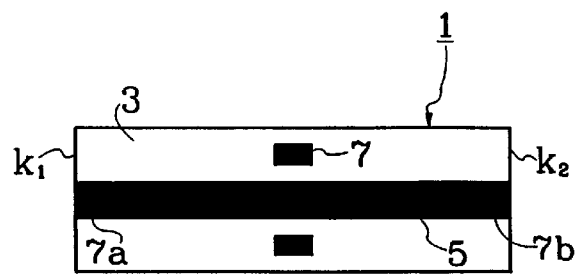
FIG. 1 illustrates a schematical view from below of a component comprising a conductor of the invention.

FIG. 1 illustrates a view from below of a component 1 according to the present invention. The component 1 comprises a dielectric layer 3, a conductor 5 and two mechanical attachment points 7.

The dielectric layer 3 is made of a non-conductive material, for instance glass epoxy FR4. The dielectric layer 3 is normally made of the same material as below described intermediate layer of a printed board.

The conductor 5 and the attachment points 7 are etched on a first side of the component 1 out of a conductive layer of or instance copper, initially covering the entire dielectric layer 3.

According to the present examples, the conductor 5 is arranged in the middle of the first side of the component, as is illustrated in FIG. 1, but also other arrangements are possible. Likewise, the conductor 5 does not have to be straight but can be inclined or have more complicated shape.

The conductor 5 according to the present example extends between a first edge $k_1$ of the component 1 to an opposite second edge $k_2$ of the component 1. The outer parts of the conductor 5 consist of a first attachment surface 7a, adjacent to the first edge $k_1$, and a second attachment surface, adjacent to the second edge $k_2$ of the component 1. These are shown in the figure.

The figure shows an example of the arrangement of the attachment points 7 on the first side of the component, wherein the attachment points 7 are symmetrically arranged around the conductor 5. The number of attachment points 7 is not limited to two, as is disclosed according to the present example, but also more or less attachment point 7 can be employed.

Figure 2:
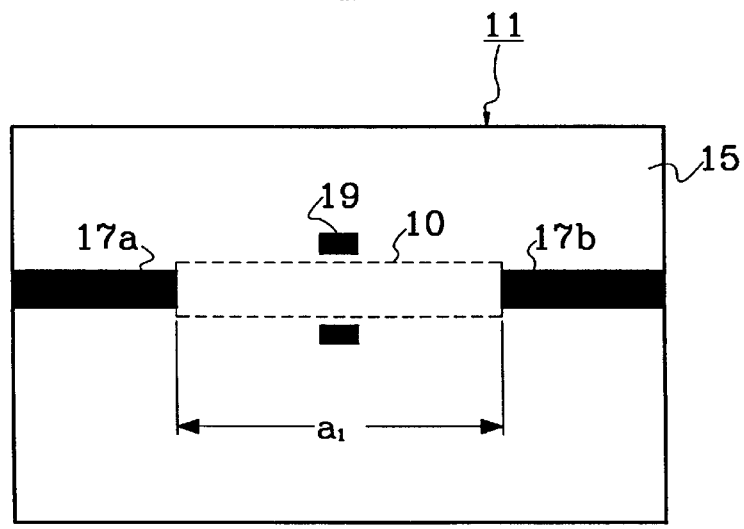
FIG. 2 illustrates a schematical view from above of a printed board of the invention.

FIG. 2 illustrates a view from above of a local area 10 of a printed board 11 according to the invention, said local area 10 requiring good transmission qualities. One example of such an local area is between two high frequency MCM (Multi Chip Modules), which are mounted on a common mother board, made of cheaper material.

Just for clarity reasons, only a part of the printed board 11 is showed in FIG. 2, as in all figures.

The printed board 11 comprises a support 13 (shown in FIG. 4), an intermediate layer 15, two pattern conductors 17a, 17b and two attachment surfaces 19.

The support is made of an electrically conductive material, for instance brass, copper or aluminium.

The intermediate layer 15 is made of a dielectric material, for instance glass epoxy FR4.

The pattern conductors 17a, 17b and the attachment surfaces 19 are etched out of a first side of the printed board 11 out of a conductive pattern layer, made of an electrically conductive material, such as for instance copper, initially covering the entire intermediate layer 15.

In the present examples, good transmission qualities are to be obtained of the local area 10 of the printed board 11, wherein the pattern conductors 17a, 17b on the printed board 11 are etched so they are adjacent to the local area 10.

The component 1 above is dimensioned so that when it is arranged over the local area 10 on the printed board 11, the first attachment surface 7a and the second attachment surface 7b of the conductor should overlap the local area adjacent ends of the pattern conductors 17a, 17b of the printed board 11.

Thus, the distance between the ends of the pattern conductors, designated $a_1$ in the figure, on the printed board 11 is less that the length of the conductor of the component 1 according to the present example.

FIG. 2 illustrates an example of the arrangement of the pattern conductors 17a, 17b and the attachment surfaces 19 on the first side of the printed board. The number of pattern conductors 17a, 17b and attached surfaces 19 is not limited to the number which is illustrated in the figure.

In FIG. 3 is illustrated a view from above the component 1, disclosed above, mounted with the conductor 5 facing the printed board 11 over the local area 10 of the printed board 11.

The attachment points 7 of the component 1 are fixed by for instance soldering joints or electrically conductive glue to the attachment surfaces 19 on the printed board 11. Likewise, the first attachment surface 7a of the conductor and the second attachment surface 7b are fixed by soldering joints 21 to the overlapping ends of corresponding pattern conductor 17a, 17b.

Figure 3A:
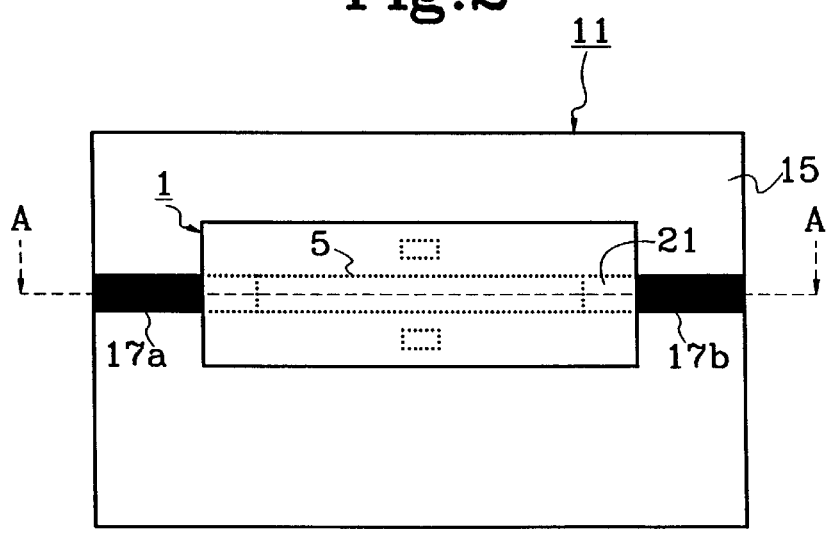
FIG. 3a illustrates a schematical view from above of the component mounted on the printed board of the invention.
Figure 3B:
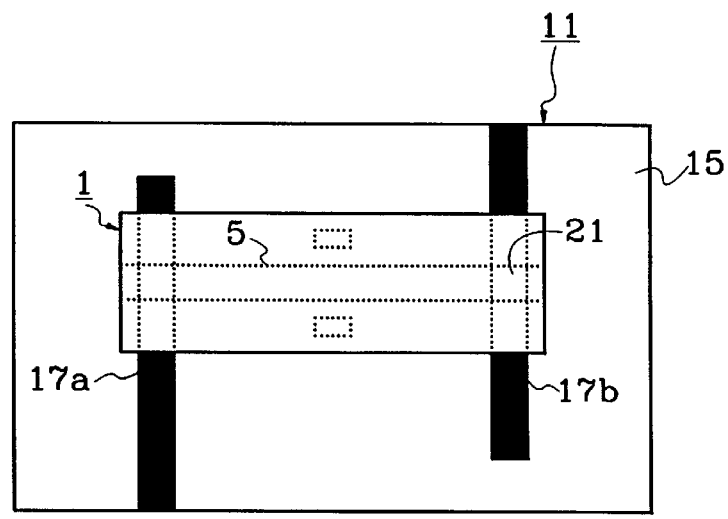
FIG. 3b illustrates a schematical view from above of yet another embodiment when the component is mounted on the printed board of the invention.

An alternative to the examples above is illustrated in FIG. 3b. Here, the pattern conductors 17a, 17b are etched out of the conductive pattern of the first side of the printed board so the pattern conductors 17a, 17 extend parallel to an edge of the local area 10.

The component 1 is mounted with the conductor 5 facing the printed board 11 over the local area 10 on the printed board 11, wherein the first attachment surface 72 of the conductor and the second attachment surface 7b overlap a part each of the to the local area 10 adjacent pattern conductors 17a, 17b.

Correspondingly as above, the first attachment surface 7a and the second attachment surface 7b are fixed by soldering joints 21, or alternatively electrically conductive glue to the overlapping part of corresponding pattern conductor 17a, 17b.

Figure 4:
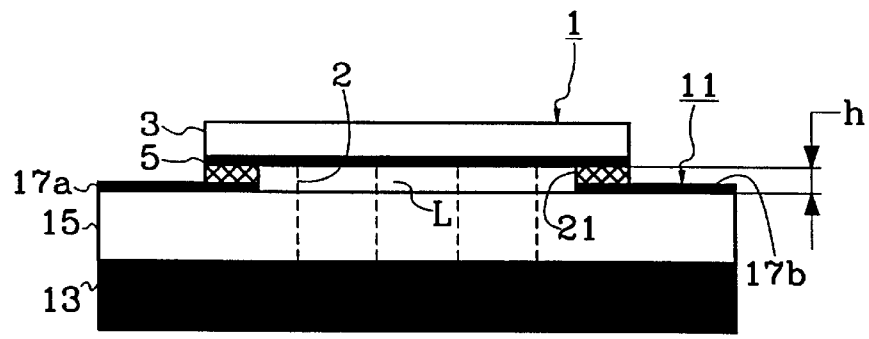
FIG. 4 illustrates a cross-section A—A of FIG. 3a of the component mounted on the printed board of the invention.

A cross-section A—A of FIG. 3a of the component 1 mounted facing the printed board 11 is shown in FIG. 4. The soldering joints 21 connects the conductor 5 of the component 1 to corresponding pattern conductor 17a, 17b of the printed board 11. As is illustrated in the figure, the thickness of the soldering joints and the thickness of the pattern conductors form an air gap L between the surface of the conductor, facing the printed board 11, and the surface of the intermediate layer 15 of the printed board 11. The height of the air gap L, designated h in FIG. 4, can be varied as required by varying the thickness of the soldering joint 21.

For instance the height h of the air gap of 145 µm is obtained if each soldering joint 21 has a thickness of 100 µm and the pattern conductors have a thickness of 45 µm.

Furthermore, as shown in FIGS. 2 and 4, the air gap has a uniform width that is equal to a predetermined distance of the gap between the ends of the first and second conductors, the air gap also has uniform height and width dimensions between the component and the printed board.

An electro magnetic field 2, designated by dashed lines in the figure, occurs in a known way between the conductor 5 and the support 13. The air gap L between the conductor 5 and the intermediate layer 15, accomplish that the losses due to the field decrease between the conductor 5 and the support 13. Thereby the conductor 5 according to the present invention has better transmission qualities than a conductor of a solid dielectric.

The air gap L will accomplish that also the heat liberated from the conductor 5 decreases. The invention is in particular applicable at local areas on printed boards used at high frequencies as the energy losses in a solid dielectric can be severe and large amounts of heat is liberated in the pattern conductors.

The different thickness of the layers of the component 1 and the printed board 11 are for reasons of clarity, enlarged in FIG. 4, as well as in all figures.

Figure 5:
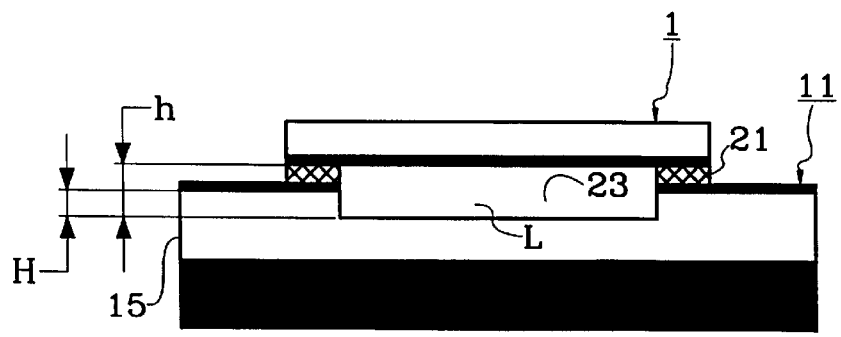
FIG. 5 illustrates a cross-section A—A of FIG. 3a of the component mounted on the printed board of an alternative embodiment of the invention.

FIG. 5 illustrates an alternative embodiment of the invention according to previous examples, wherein a groove 23 in the intermediate layer 15 of the printed board 11 is employed for obtaining a larger height h of the air gap L.

Correspondingly, as disclosed above and in FIG. 4, the component 1 is mounted over the local area 10 of the printed board 11 and the conductor 5 is connected by the soldering joints 21 to the pattern conductors 17a, 17b.

The groove 23 is milled out of the local area 10 of the printed board 11 through the intermediate layer 15, wherein the height of the groove 23 is designated H in the figure. The height H of the groove 23 can be varied as required.

Thus, the height h of the air gap L between the surface of the conductor, facing the groove 23 and the surface of the groove, facing the conductor 5, according to the present example is the sum of the height H of the groove, the thickness of the soldering joints and the thickness of the pattern conductors.

Thus, according to the present examples a larger layer of air is obtained, i. e., the air gap L, and a smaller layer of dielectric, i. e., the intermediate layer 15, between the conductor 5 and the support 13 than in the previous examples.

In the following examples, a method of the invention will be described with reference to the above disclosed example and FIGS. 6–7, and above disclosed FIGS. 1, 2, 4 and 5.

According to the method of the invention the component 1 and a mounting surface for the component 1 on the predetermined local area 10, as described above, will be produced. Furthermore, the component 1 will be mounted over the local area 10 on the printed board 11, rendering the local area 10 by the component 1 good transmission qualifies.

The method for production the component 1 is disclosed below with reference to FIG. 6 and FIG. 1.

Figure 6:
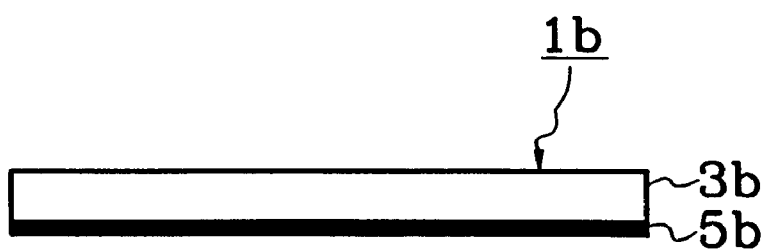
FIG. 6 illustrates a schematical cross-section of a dielectric layer plated with an electrically conductive layer of the invention.

FIG. 6 illustrates a board 1b comprising a dielectric layer 3b plated with an electrically conductive layer 5b.

The dielectric layer 3b is made of a non-conductive material, for instance glass epoxy FR4 and the dielectric layer 3b is as disclosed above normally made of the same material as above disclosed intermediate layer 15 of the printed board 11 for minimizing problems occurring with the elongation between the component 1 and the printed board 11.

The method is started by etching out the conductor 5 using a mask and the attachment points 7, as disclosed above with reference to FIG. 1, of the conductive layer 5b of the board 1b. Thereby, the component 1 is obtained as is illustrated in FIG. 1.

Also other methods can be used for etching out the conductor 5 and the attachment points 7, such as etching with photo resist or pattern plating.

The conductor 5 extends according to the present examples as disclosed above, between the first edge $k_1$ and the second edge $k_2$ of the component 1 and the attachment points 7 are arranged on each side of the conductor 5.

The method for production of the mounting surface for the component 1 on the predetermined local area 10 is disclosed below with reference to FIG. 7 and FIG. 2.

Figure 7:
FIG. 7 illustrates a schematical cross section of the printed board of the invention.

FIG. 7 illustrates a cross-section of the printed board 11 as disclosed above with the intermediate layer 15 fixed to the support 13, wherein the intermediate layer 15 is plated with an electrically conductive pattern layer 17. The pattern layer 17 can for instance consist of copper.

The method is started for instance using a mask to etch out the pattern conductors 17a, 17b and the attachment surfaces 19, of the pattern layer 17, as disclosed above with reference to FIG. 2. The pattern conductors 17a, 17b are etched out to be adjacent to the local area 10. See also FIG. 2.

The method of mounting the component 1 over the local area 10 on the printed board 11 is described below with reference to above-described FIG. 4 and 5.

The method is initiated by application of soldering paste on the mechanical attachment points 7, the first attachment surface 7a and on the second attachment surface 7b of the component 1. Subsequently, the component 1 is arranged with the conductor 5 facing the printed board 11 over the local area 10 of the printed board 11.

By heating, the attachment points 7 of the component 1 are soldered firmly to the attachment surfaces 19 on the printed board 11. Also, the first attachment surface 7a and the second attachment surface 7b, as disclosed above, are soldered, fly to the overlapping end of corresponding pattern conductor 17a, 17b on the printed board 11, as is illustrated in FIG. 4.

The by the soldering produced soldering joints 21 between the first attachment area 7a and corresponding pattern conductor 17 and the between the second attachment surface 7b and corresponding pattern conductor 17b connect similarly as disclosed above the conductor 5 of the component 1 to corresponding pattern conductor 17a, 17b of the printed board 11.

Thereby, the air gap L is formed between the surface of the conductor, facing the printed board 11, and the local area 10 of the printed board 11, as disclosed with reference to FIG. 4.

The groove 23, described above with reference to FIG. 5, can also, according to the method of the invention, be milled out of the local area 10 of the printed board 11 through the intermediate layer 15 to obtain a higher height h of the air gap L. In this case, the groove 23 is milled out before the component 1 is mounted on the printed board 11.

What is claimed is:
1. A device in an electronics system, comprising:
a component;
attachment joints; and
a printed board,
wherein the component comprises:
a first layer of dielectric material; and
a conductor arranged on one side of the first layer of dielectric material such that it extends from a first edge of the component to a second edge of the component, the conductor having a first attachment surface proximate to the first edge of the component and a second attachment surface proximate to the second edge of the component;

wherein the printed board comprises:
- a second layer of dielectric material having poor high frequency characteristics;
- a local area arranged on a first side of the second layer of dielectric material; and
- pattern conductors arranged on the second layer of dielectric material such that each of the pattern conductors has an end that is adjacent to the local area;

wherein the component is mounted to the printed board by means of the attachment joints such that the conductor faces the printed board over the local area of the printed board, and such that the first and second attachment surfaces of the conductor overlap the local area adjacent ends of the respective pattern conductors, whereby the conductor of the component is arranged between the pattern conductors of the printed board, whereby the conductor of the component and the pattern conductors are arranged between the first and second layers of dielectric material, and whereby an air gap is formed between the component and the local area.

2. The device of claim 1, wherein a height of the air gap is substantially equal to a sum of a height of one of the attachment joints and a height of one of the pattern conductors.

3. The device of claim 1, wherein a groove is formed in the second layer of dielectric material within the local area such that a height of the air gap is substantially equal to a sum of a height of the groove, a height of one of the attachment joints and a height of one of the pattern conductors.

4. The device of claim 2, wherein the printed board further comprises a support arranged on a second side of the second layer of dielectric material.

5. The device of claim 4, wherein the support is made of an electrically conductive material.

6. The device of claim 1, wherein the attachment joints consist of soldering joints or joints of electrically conductive glue.

7. The device of claim 1, wherein said air gap has uniform height and width dimensions between said component and said printed board.

8. The device of claim 7, wherein said width dimension is defined by said pattern conductors as a space between ends of said pattern conductors.

* * * * *